United States Patent
Liao

(10) Patent No.: US 12,307,946 B2
(45) Date of Patent: May 20, 2025

(54) SERIALLY DRIVING STRUCTURE FOR DISPLAY PANEL

(71) Applicant: SITRONIX TECHNOLOGY CORP., Jhubei (TW)

(72) Inventor: Min-Nan Liao, Jhubei (TW)

(73) Assignee: Sitronix Technology Corporation, Jhubei (TW)

( * ) Notice: Subject to any disclaimer, the term of this patent is extended or adjusted under 35 U.S.C. 154(b) by 0 days.

(21) Appl. No.: 17/563,438

(22) Filed: Dec. 28, 2021

(65) Prior Publication Data
US 2022/0375398 A1 Nov. 24, 2022

Related U.S. Application Data

(60) Provisional application No. 63/131,067, filed on Dec. 28, 2020.

(51) Int. Cl.
*G09G 3/32* (2016.01)
*H01L 25/16* (2023.01)

(52) U.S. Cl.
CPC ....... *G09G 3/32* (2013.01); *G09G 2300/0871* (2013.01); *G09G 2310/0291* (2013.01);
(Continued)

(58) Field of Classification Search
CPC .. G09G 3/3266; G09G 3/3648; G09G 3/3233; G09G 3/3225; G09G 3/32; G09G 3/3258; G09G 3/325; G09G 3/3283; G09G 3/3614; G09G 2330/021; G09G 2310/08; G09G 2310/0297; G09G 2310/0286;
(Continued)

(56) References Cited

U.S. PATENT DOCUMENTS

| | | | |
|---|---|---|---|
| 10,283,037 B1 * | 5/2019 | Far | G09G 3/32 |
| 2003/0218588 A1 * | 11/2003 | Kumagai | G09G 3/3688 |
| | | | 345/87 |

(Continued)

FOREIGN PATENT DOCUMENTS

| CN | 1588185 A | 3/2005 |
|---|---|---|
| CN | 101692330 A | 4/2010 |

(Continued)

OTHER PUBLICATIONS

Search Report appended to an Office Action, which was issued to Foreign Counterpart Application No. 11121211020/110149237.
(Continued)

*Primary Examiner* — Dong Hui Liang
(74) *Attorney, Agent, or Firm* — Rosenberg, Klein & Lee

(57) ABSTRACT

The present application discloses a driving structure for display panel, which comprises at least one driving group and at least one control circuit. The driving group is disposed on a display panel. Each of the driving group includes a plurality of drivers. The drivers are coupled to each other in serial. Each of the drivers is coupled to at least one display component of the display panel. The control circuit is disposed on the display panel, coupled to the driving group, and controls the driving group. The driving structure according to the present application is applied to the display panel, that requires no scan lines disposed on the display panel for reducing the complex of the structure of the display panel.

18 Claims, 3 Drawing Sheets

(52) U.S. Cl.
CPC . *G09G 2310/08* (2013.01); *G09G 2320/0626* (2013.01); *H01L 25/167* (2013.01)

(58) Field of Classification Search
CPC ....... G09G 2310/061; G09G 2320/045; G09G 2320/0626; G09G 2320/0233; G09G 2320/0247; G09G 2320/043; G09G 2320/0261; G09G 2300/0426; G09G 2300/0842; G09G 2354/00; G09G 2340/0407; G09G 2360/06
See application file for complete search history.

(56) References Cited

U.S. PATENT DOCUMENTS

| | | | | |
|---|---|---|---|---|
| 2004/0252112 | A1* | 12/2004 | Fukuda | G09G 3/3611 345/204 |
| 2007/0195048 | A1 | 8/2007 | Nam et al. | |
| 2015/0339998 | A1* | 11/2015 | Yen | G09G 3/3674 345/100 |
| 2018/0197471 | A1* | 7/2018 | Rotzoll | H01L 25/0753 |
| 2022/0020310 | A1* | 1/2022 | Gray | G09G 3/2088 |
| 2022/0172674 | A1* | 6/2022 | Oh | G09G 3/32 |

FOREIGN PATENT DOCUMENTS

| | | |
|---|---|---|
| CN | 101692332 A | 4/2010 |
| CN | 101853624 A | 10/2010 |
| CN | 104134421 A | 11/2014 |
| CN | 105590576 A | 5/2016 |
| CN | 110599898 A | 12/2019 |
| CN | 110751924 A | 2/2020 |
| CN | 110890393 A | 3/2020 |
| KR | 20100135642 A | 12/2010 |
| TW | 200717395 A | 5/2007 |
| TW | 200743092 A | 11/2007 |
| TW | 200839710 A | 10/2008 |
| TW | 201005704 A | 2/2010 |
| TW | 201105175 A | 2/2011 |
| TW | 201229986 A | 7/2012 |
| TW | 201312521 A | 3/2013 |
| TW | 201638704 A | 11/2016 |

OTHER PUBLICATIONS

First Office Action for Corresponding Chinese Patent Application No. 202111627129.1 on Jul. 21, 2023.
Office Action mailed to Chinese Counterpart Patent Application No. 202111627129.1 on Apr. 10, 2024.
Official Action with attached Search Report mailed to Corresponding Chinese Patent Application No. 202111627129.1 dated Sep. 29, 2024.

* cited by examiner

SERIALLY DRIVING STRUCTURE FOR DISPLAY PANEL

FIELD OF THE INVENTION

The present application relates generally to a driving structure, and particularly to a driving structure for display panel.

BACKGROUND OF THE INVENTION

Display units have become indispensable components in electronic products for displaying information, and have been developed from liquid crystal display units to mini LED and micro LED display units. Owing to the evolution of display units, the driving structure according to the prior art is no longer applicable to modern display panels, such as mini LED or micro LED display panels. By adopting the driving structure according to the prior art to drive display panels, scan lines must be disposed on the display panel and hence increasing the complexity of the structure of display panels.

Accordingly, the present application provides a driving structure for display panel. By adopting this driving structure, no scan line is required on the display panels and hence simplifying the structure of display panels.

SUMMARY

An objective of the present application is to provide a driving structure for display panel, which comprises at least one driving group. The driving group includes a plurality of drivers coupled to each other in series. The drivers receive input data at different time. In other words, the pixel data in the input data received by the drivers are different for driving a plurality of display components on the display panel. Thereby, no scan line is required on the display panel. Another objective of the present application is to provide a driving structure for display panel. The driver includes a storage circuit for storing data. When the data stored in the storage circuit is not updated, the driver may drive the display component to display images according to the stored data.

The present application provides a driving structure for display panel, which comprises at least one driving group and at least one control circuit. The driving group and the control circuit are disposed on a display panel. Each driving group includes a plurality of drivers coupled to each other in series. Each driver is coupled to at least one display component of the display panel. The control circuit is coupled to the driving group and controls the driving group. By using the driving structure according to the present application to drive a display panel, no scan line is required on the display panel and hence simplifying the structure of the display panel.

DETAILED DESCRIPTION

In order to make the structure and characteristics as well as the effectiveness of the present application to be further understood and recognized, the detailed description of the present application is provided as follows along with embodiments and accompanying figures.

In the specifications and subsequent claims, certain words are used for representing specific circuits. A person skilled in the art should know that hardware manufacturers might use different names to call the same circuit. In the specifications and subsequent claims, the differences in names are not used for distinguishing circuits. Instead, the differences in entire techniques are the guidelines for distinguishing. In the whole specifications and subsequent claims, the word "comprising/including" is an open language and should be explained as "comprising but not limited to". Besides, the word "couple" includes any direct and indirect electrical connection. Thereby, if the description is that a first device is coupled to a second device, it means that the first device is connected electrically to the second device directly, or the first device is connected electrically to the second device via other device or other connecting means indirectly.

Figure 1:
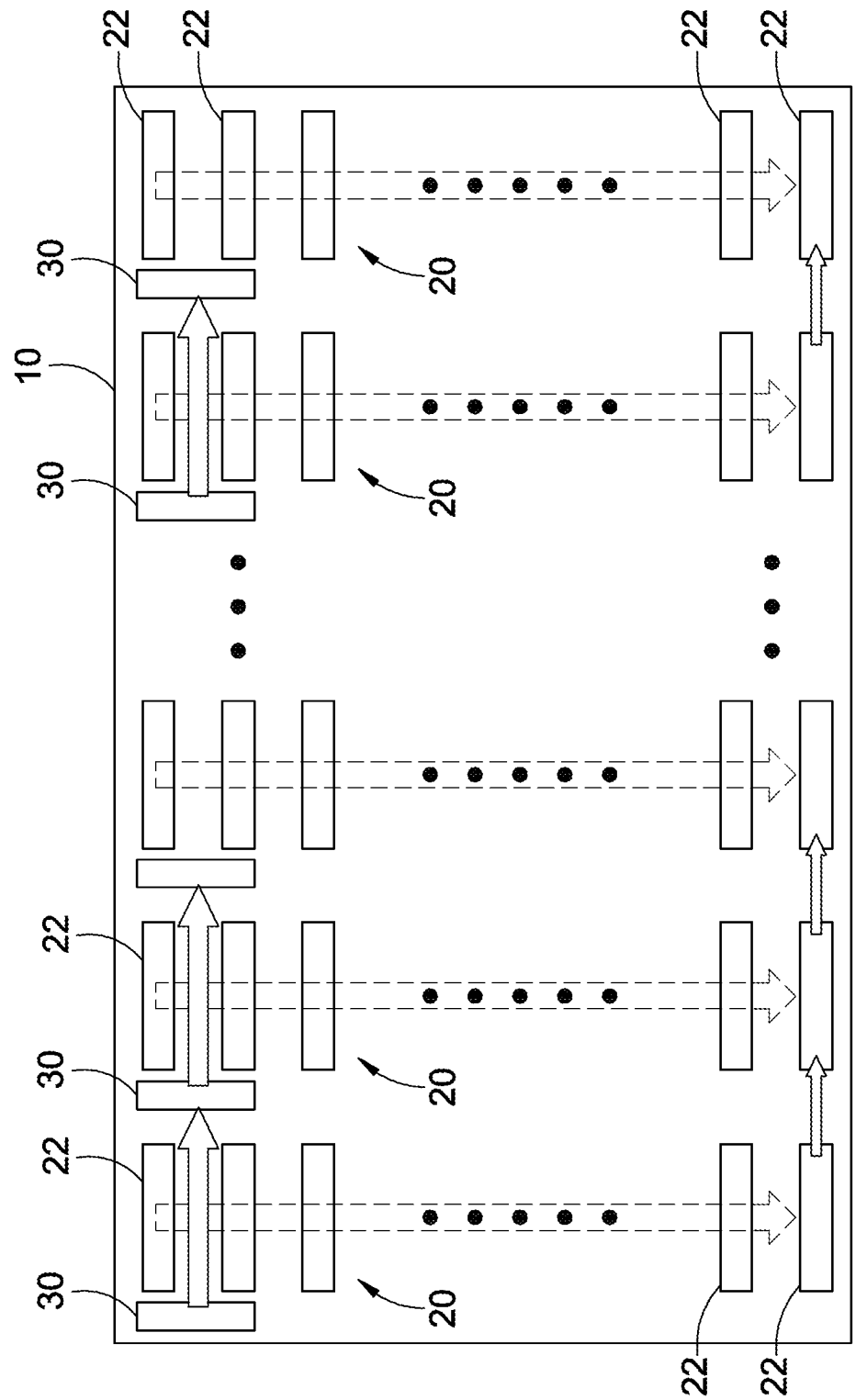
FIG. 1 shows a schematic diagram of the driving structure according to an embodiment of the present application.

Please refer to FIG. 1, which shows a schematic diagram of the driving structure according to an embodiment of the present application. As shown in the figure, the driving structure according to the present application is used for driving a display panel 10 to display images. The driving structure comprises at least one driving group 20 and at least one control circuit 30. According to the present embodiment, a plurality of driving groups 20 and a plurality of control circuits 30 are adopted in the driving structure for describing the driving structure according to the present application. The driving groups 20 and the control circuits 30 are disposed on the display panel 10. The control circuits 30 are coupled to the driving groups 20 and control the driving groups 20. According to an embodiment of the present application, each control circuit 30 may be an independent chip. Nonetheless, the present application is not limited to the embodiment. Instead, the control circuits 30 may be integrated into a chip.

Figure 2:
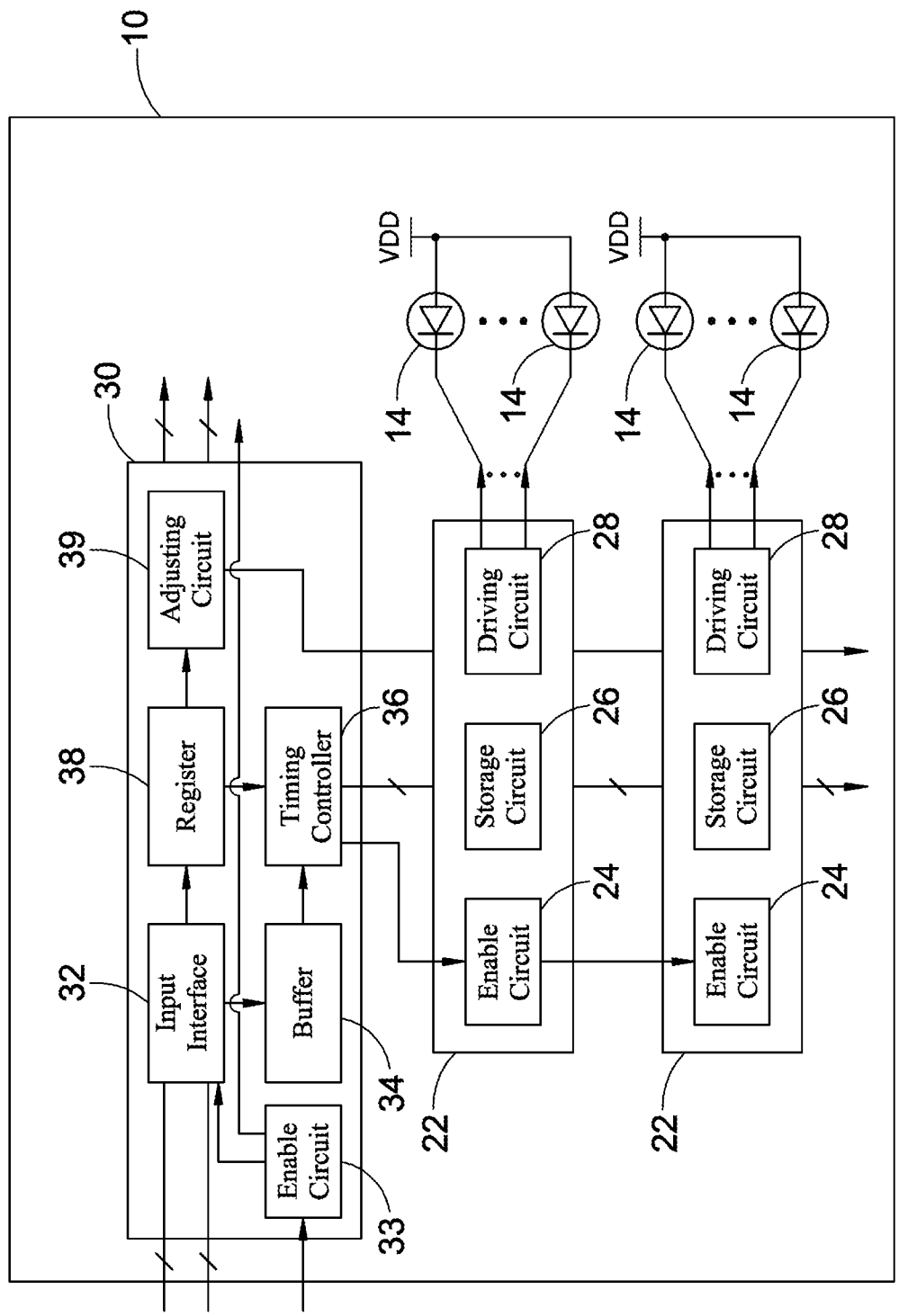
FIG. 2 shows a block diagram of the control circuit and the driving group according to an embodiment of the present application.

In addition, each driving group 20 includes a plurality of drivers 22 coupled to each other in series. The drivers 22 of each driving group 20 are disposed on the display panel 10 along a direction. According to the present embodiment, the drivers 22 of each driving group 20 are disposed on the display panel 10 along a vertical direction, meaning that the driving groups 20 are disposed on the display panel 10 along a longitudinal direction, and adjacent to one another. Nonetheless, the present application is not limited to the embodiment. According to an embodiment of the present application, each driver 22 may be an independent chip. Nonetheless, the present application is not limited to the embodiment. Each driver 22 is coupled to at least one display component 14 (as shown in FIG. 2) of the display panel 10 for driving the display component 14 to display images. The display component 14 may be a mini LED or a micro LED. The display panel 10 may be a mini LED display panel or a micro LED display panel. Nonetheless, the driving structure according to the present application is applicable not only to the above two display panel types. The control circuits 30 are coupled to the driving groups 20 for controlling the driving groups 20.

Please refer again to FIG. 1. The control circuit 30 transmits an input data to the driving group 20. According to an embodiment of the present application, the input data may be a serial data including a plurality of pixel data. The drivers 22 of the driving group 20 are all coupled to a bus (not shown in the figure). The control circuit 30 transmits the input data to the bus. The drivers 22 receive the input data via the bus. The drivers 22 receive the input data at different time. Thereby, the pixel data received by the drivers 22 will be different, respectively. For example, when a driver 22 of the driving group 20 receives the input data, the other drivers 22 do not receive the input data. After this driver 22 receives the pixel data of the input data, another driver 22 is driven by this driver 22 to receive the input data for receiving another pixel data of the input data. Since the above two drivers 22 receive the input data at different time, the pixel data received by the two drivers 22 are different and thus driving a plurality of display components 14 of the display panel 10 to display different images. The operations of the other drivers 22 are the same as the above illustration. According to the above description, after a driver 22 receives the pixel data of the input data, another driver 22 is driven by this driver 22 to receive the other pixel data of the input data. Thereby, no scan line is required to be disposed on the display panel 10 and hence simplifying the structure of the display panel 10.

In addition, according to another embodiment of the present application, a driver 22 of a driving group 20 of the driving groups 20 may be coupled to a driver 22 of another driving group 20. For example, the last driver 22 of each driving group 20 may be coupled to each other for transmitting data or signal. Nonetheless, the present application is not limited to the embodiment. Besides, the driving groups 20 and the control circuits 30 are disposed in a display area of the display panel 10. Nonetheless, the present application is not limited to the embodiment. The control circuits 30 may be disposed in a non-display area of the display panel 10.

Please refer to FIG. 2, which shows a block diagram of the control circuit and the driving group according to an embodiment of the present application. For convenience, the driving group 20 according to the present embodiment includes two drivers 22. As shown in the figure, the control circuit 30 includes an input interface 32, an enable circuit 33, a buffer 34, a timing controller 36, a register 38, and an adjusting circuit 39. The control circuit 30 is coupled to a host, for example, the microprocessor of an electronic product, for receiving the input data, control commands, or related control parameters. The input interface 32 receives the input data, the control commands, or the control parameters. The enable circuit 33 is coupled to the input interface 32 and enables the input interface 32 according to a received enable signal for driving the input interface 32 to receive the input data, the control commands, or the control parameters.

Please refer again to FIG. 2. The buffer 34 is coupled to the input interface 32 and the timing controller 36. The input interface 32 transmits the input data to the buffer 34. The buffer 34 buffers the input data and transmits the buffered input data to the timing controller 36. The timing controller 36 transmits the input data to the driving group 22 via the bus and outputs a timing signal to the driver 22 of the driving group 22 for controlling the operation of the driver 22. The register 38 is coupled to the input interface 32, the timing controller 36, and the adjusting circuit 39. The input interface 32 transmits the control parameters to the register 38. The register 38 stores the control parameters and provides the control parameters to the timing controller 36 and the adjusting circuit 39. The tuning controller 36 generates the timing signal according to the control parameters. The adjusting circuit 39 generates an adjusting signal to the driver 22 according to the control parameters for adjusting the intensity of a driving signal generated by the driver 22. The driving signal is used for driving the display components 14 of the display panel 10. The intensity of the driving signal determines the brightness of the display components 14.

Please refer again to FIG. 2. Each driver 22 includes an enable circuit 24, a storage circuit 26, and a driving circuit 28. The storage circuit 26 is coupled to the timing controller 36 of the control circuit 30 via the bus for receiving the input data transmitted by the timing controller 36. The enable circuit 24 is coupled to the storage circuit 26 and enables the storage circuit 26 for driving the storage circuit 26 to receive and store the input data. According to an embodiment of the present application, the enable circuit 24 enables the storage circuit 26 for a predetermined time. The storage circuit 26 receives the input data in the predetermined time and stores the received input data. The enable circuit 24 disables the storage circuit 26 after the predetermined time. Then, the storage circuit 26 stops receiving the input data.

For example, the enable circuit 24 of the first driver 22 is coupled to the timing controller 36 of the control circuit 30. The timing controller 36 transmits an enable signal to the enable circuit 24 of the first driver 22 for driving the enable circuit 24 of the first driver 22 to enable the storage circuit 26 receiving the input data. Namely, the timing controller 36 drives the first driver 22 to receive the input data. The above enable signal of the timing controller 36 may be a clock signal. When the enable circuit 24 of the first driver 22 enables the storage circuit 26 of the first driver 22, the enable circuits 24 of the rest drivers 22 disable the storage circuits 26 of the rest drivers 22 and hence no input data will be received. After the enable circuit 24 of the first driver 22 disables the storage circuit 26 of the first driver 22, it transmits an enable signal to the enable circuit 24 of another driver 22. According to an embodiment of the present application, the enable circuit 24 of the first driver 22 transmits an enable signal to the enable circuit 24 of the second driver 22 for driving the enable circuit 24 of the second driver 22 to enable the storage circuit 26 of the second driver 22 to receive the input signal for the predetermined time. Likewise, after the predetermined time, the enable circuit 24 of the second driver 22 disables the storage circuit 26 of the second driver 22 and transmits an enable signal to the enable circuit 24 of another driver 22, for example, the enable circuit 24 of the third driver 22, for enabling the storage circuit 26 of the another driver 22. According to the above illustration, the storage circuits 26 of the drivers 22 receive the input data at different time, which is equivalent to time-division reception of the input data. Thereby, the pixel data in the input data received by the storage circuits 26 of the drivers 22 are different. For example, the pixel data received and stored by the storage circuit 26 of the first driver 22 is different from the pixel data received and stored by the storage circuit 26 of the second driver 22.

Furthermore, it is not limited to that the timing controller 36 should transmit the enable signal to the enable circuit 24 of the first driver 22 initially. Instead, the timing controller 36 may transmit the enable signal to the enable circuit 24 of another driver 22 according to the requirements, for example, the enable circuit 24 of the second driver 22. Besides, as described above, after the enable circuit 24 of the first driver 22 disables the storage circuit 26 of the first driver 22, the enable circuit 24 of the first driver 22 transmits an enable signal to the enable circuit 24 of the second driver 22. Nonetheless, the present application is not limited to the embodiment. The order of enabling the drivers 22 to receive the input signal may be arranged according to requirements.

Please refer again to FIG. 2. The driving circuit 28 of each driver 22 is coupled to the storage circuit 26 and at least one display component 14 of the display panel 10. The driving circuit 28 receives the pixel data of the input data stored in the storage circuit 28 and generates a driving signal according to the received pixel data for driving the display component 14 to display images. In addition, the adjusting circuit 39 of the control circuit 30 is coupled to the driving circuits 28 of the drivers 22. The adjusting circuit 39 outputs an adjusting signal to the driving circuits 28 for adjusting the intensity of the driving signals output by the driving circuits 28 and thus adjusting the brightness of the display components 14. According to an embodiment of the present application, the adjusting signal is a voltage. By changing the voltage level, the intensity of the driving signals may be adjusted.

Please refer again to FIG. 1 and FIG. 2. The control circuits 30 are coupled to each other in series and arranged along a direction. According to the present embodiment, the control circuits 30 are arranged on the display panel 10 in the transverse direction. Nonetheless, the present application is not limited to the present embodiment. According to an embodiment of the present application, the enable circuit 33 of a control circuit 30 of the control circuits 30 enables the input interface 32 for a predetermined time to drive the input interface 32 for receiving the input data within the predetermined time. After the enable circuit 33 enables the input interface 32 for the predetermined time, the enable circuit 33 disables the input interface 32. Then, the input interface 32 stops receiving the input data. Within the predetermine time, the enable circuits 33 of the rest control circuits 30 disable the input interfaces 32 of the rest control circuits 30 and no input data is received. In addition, after the enable circuit 33 enables the input interface 32 for the predetermined time, the enable circuit 33 disables the input interface 32 and transmits an enable signal to the enable circuit 33 of another control circuit 30 for enabling the input interface 32 of another control circuit 30 to receive the input signal. Thereby, the control circuits 30, like the drivers 22, receive the input signals time-divisionally. The input signals received by the control circuits 30 are different. According to another embodiment of the present application, it is not required that the control circuits 30 should be coupled in series. The control circuits 30 may receive the input data from the host (not shown in the figure). The host may control the control circuits 30, respectively, for driving the control circuits 30 to receive the input data. Thereby, it is not required for the control circuits 30 to include the enable circuits 33.

Figure 3:
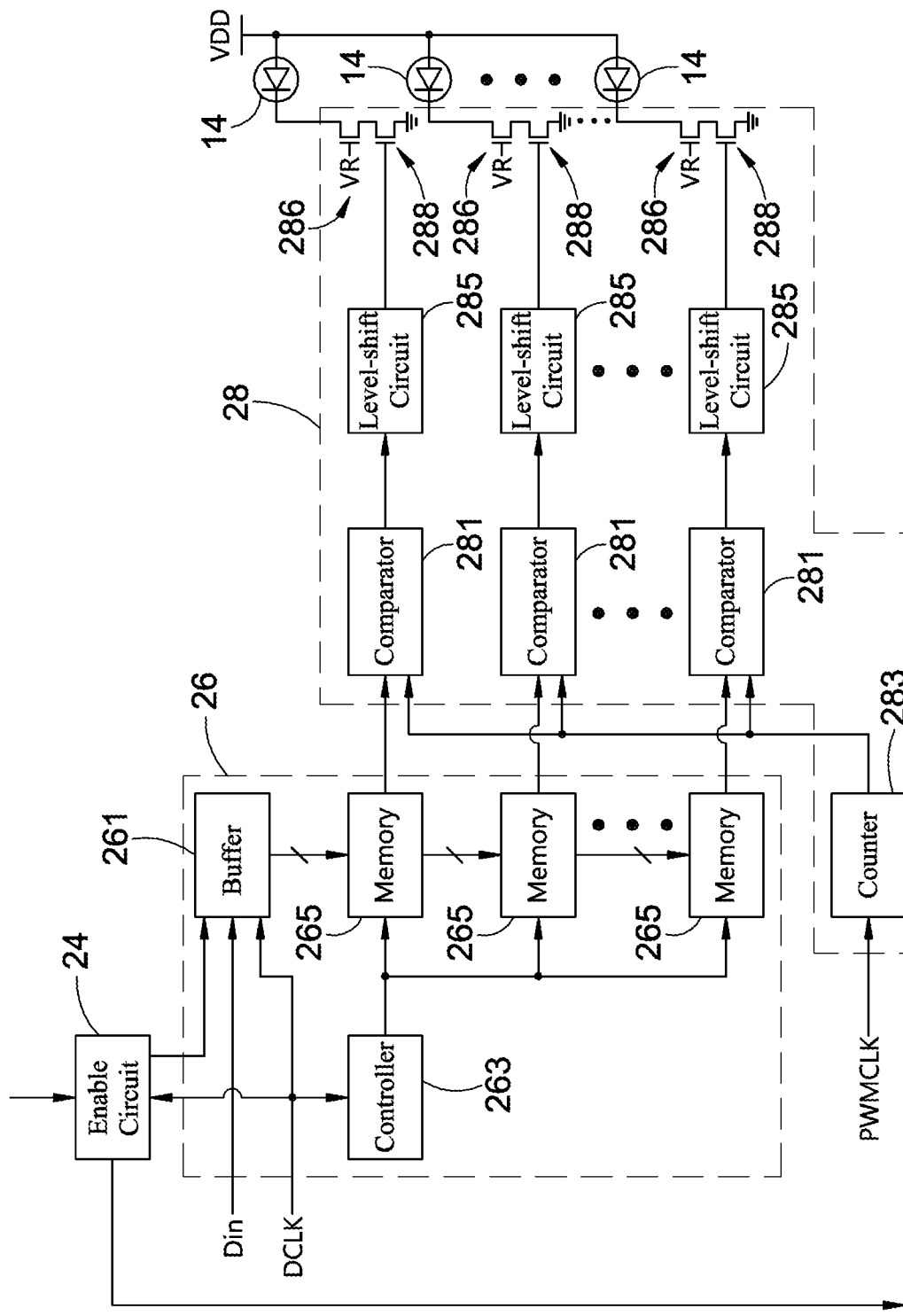
FIG. 3 shows a circuit diagram of the storage circuit and the driver according to an embodiment of the present application.

Please refer to FIG. 3, which shows a circuit diagram of the storage circuit and the driver according to an embodiment of the present application. As shown in the figure, each storage circuit 26 includes a buffer 261, a controller 263, and a plurality of memories 265. The buffer 261 is coupled to the enable circuit 24 and receives the input data Din and a clock signal DCLK. The enable circuit 24 enables the buffer 261 according to the received enable signal and the clock signal DCLK for driving the buffer 261 to receive the input data Din according to the clock signal DCLK. The buffer 261 buffers the input data Din. The buffer 261 and the memories 265 are coupled to a bus (not shown in the figure). The buffer 261 outputs the input data Din to the bus. The memories 265 may receive the input data Din from the bus and store the input data Din. The controller 263 is coupled to the memories 265, receives the clock signal DCLK, and controls the memories 265 to receive the input data Din from the bus at different time, respectively, according to the clock signal DCLK. In other words, the memories 265 receive the input data. Din from the bus time-divisionally. Thereby, the pixel data of the input data. Din received by the memories 265 are different. According to an embodiment of the present application, the controller 263 may be a counter, which counts according to the clock signal DCLK for controlling the memories 265 to receive the input data Din output by the buffer 261 from the bus at different time.

Please refer again to FIG. 3. The driving circuit 28 includes a plurality of comparators 281, a counter 283, a plurality of level-shift circuits 285, and a plurality of signal generating circuits. The comparators 281 are coupled to the memories 265 and the counter 283. The counter 283 receives a clock signal PWMCLK and counts according to the clock signal PWMCLK for outputting a counting signal. The counting signal changes according to the counting of the counter 283. Each comparator 281 receives the counting signal and pixel data of the input data Din stored in the memory 265 and compares the counting signal and the pixel data. When the pixel data is greater than the counting signal, the comparator 281 outputs a driving level, for example, a high level. According to another embodiment of the present application, when the pixel data is less than the counting signal, the comparator 281 outputs the driving level.

The level-shift circuits 285 are coupled to the comparators 281, convert the driving levels output by the comparators 281, and generate an enable level. Each signal generating circuit includes a first transistor 286 and a second transistor 288. The first transistor 286 and the second transistor 288 are coupled to each other in series. One terminal of the first transistor 286 is coupled to a terminal of the display component 14. One terminal of the second transistor 288 is coupled to the ground. The level-shift circuits 285 are coupled to the gate of the second transistor 288 of the signal generating circuits and output the enable level to the gate of the second transistor 288 for turning on the second transistor 288 and hence generating the driving signal for driving the display component 14 to emit light and display images. The driving signal is a current flowing from a supply voltage VDD to the ground. The supply voltage VDD is coupled to the other terminal of the display component 14. In addition, the gate of the first transistor 286 is coupled to the adjusting signal VR transmitted by the adjusting circuit 39 of the control circuit 30. The adjusting signal VR may control the turning-on level of the first transistor 286, and thus controlling the magnitude of the current flowing through the display component 14 and controlling the brightness of the display component 14. According to the above description, the time of the comparators 281 continuously generating the driving level is the driving time, namely, the time for driving the display component 14. The driving time determines the brightness of the display component 14.

Accordingly, the present application conforms to the legal requirements owing to its novelty, nonobviousness, and utility. Thereby, the present application is filed to the patent office for obtaining the allowance of the present application. Thanks a lot.

However, the foregoing description is only embodiments of the present application, not used to limit the scope and range of the present application. Those equivalent changes or modifications made according to the shape, structure, feature, or spirit described in the claims of the present application are included in the appended claims of the present application.

The invention claimed is:

1. A serially driving structure for display panel, comprising:
    at least one driving group, disposed on a display panel, each said driving group including a plurality of drivers coupled in series, and each driver coupled to at least one display component of said display panel; and
    at least one control circuit, disposed on said display panel, coupled to said driving group, and controlling said driving group, said control circuit comprising:
        an input interface, receiving an input data;
        a buffer, coupled to said input interface, and buffering said input data; and
        a timing controller, coupled to said buffer, receiving said input data, outputting said input data to said driving group, and driving a driver of said driving group for receiving said input data;
    wherein each said driver includes an enable circuit, said enable circuit enables said driver receiving said input data transmitted by said control circuit, after said enable circuit enables said driver, said enable circuit disables said driver for receiving said input data and drives said enable circuit of another driver to enable said another driver receiving said input data transmitted by said control circuit.

2. The serially driving structure of claim 1, wherein said at least one driving group includes a plurality of driving groups; said at least one control circuit includes a plurality of control circuits; and said control circuits are coupled to said driving groups and control said driving groups.

3. The serially driving structure of claim 2, wherein said control circuits are coupled in series; after a control circuit of said control circuits receives said input data, said control circuit drives another control circuit of said control circuits to receive said input data.

4. The serially driving structure of claim 3, wherein each said control circuit comprises:
    an enable circuit, coupled to said input interface, and enabling said input interface for receiving said input data;
    wherein after said enable circuit of said control circuit enables said input interface, said enable circuit of said control circuit disables said input interface for receiving said input data and drives said enable circuit of said another control circuit to enable said input interface of said another control circuit to receive said input data.

5. The serially driving structure of claim 1, wherein each said driver includes:
    a storage circuit, coupled to said control circuit, and storing said input data transmitted by said control circuit; and
    said enable circuit, coupled to said storage circuit, and enabling said storage circuit for receiving said input data;
    wherein after said enable circuit enables said storage circuit, said enable circuit disables said storage circuit for receiving said input data and drives said enable circuit of said another driver to enable said storage circuit of said another driver receiving said input data transmitted by said control circuit.

6. The serially driving structure of claim 5, wherein said control circuit includes said timing controller coupled to said storage circuit for transmitting said input data to said storage circuit; and said timing controller is further coupled to said enable circuit and drives said enable circuit to enable said storage circuit.

7. The serially driving structure of claim 1, wherein each said driver includes a driving circuit and said driving circuit drives said at least one display component according to said input data.

8. The serially driving structure of claim 7, wherein said control circuit includes an adjusting circuit coupled to said driving circuit; said adjusting circuit adjusts the intensity of a driving signal output by said driving circuit; and said driving signal drives said display component of said display panel.

9. The serially driving structure of claim 1, wherein said drivers of each said driving group are disposed on said display panel along a direction.

10. The serially driving structure of claim 1, wherein said at least one driving group includes a plurality of driving groups, and a driver of a driving group of said driving groups is coupled to a driver of another driving group of said driving groups.

11. The serially driving structure of claim 1, wherein said control circuit is located in a display area of said display panel.

12. A serially driving structure for display panel, comprising:
    at least one driving group, disposed on a display panel, each said driving group including a plurality of drivers coupled in series, and each driver coupled to at least one display component of said display panel; and
    at least one control circuit, disposed on said display panel, coupled to said driving group, and controlling said driving group, said control circuit comprising:
        an input interface, receiving an input data;
        a buffer, coupled to said input interface, and buffering said input data; and
        a timing controller, coupled to said buffer, receiving said input data, outputting said input data to said driving group, and driving a driver of said driving group for receiving said input data;
    wherein two drivers of each said driving group receive said input data at different time and drive said at least one display component coupled to said two drivers of each said driving group, each said driver includes an enable circuit, said enable circuit enables said driver receiving said input data transmitted by said control circuit, after said enable circuit enables said driver, said enable circuit disables said driver for receiving said input data and drives said enable circuit of another driver to enable said another driver receiving said input data transmitted by said control circuit.

13. The serially driving structure of claim 12, wherein each said driver includes:
    a storage circuit, coupled to said control circuit, and storing said input data transmitted by said control circuit; and
    said enable circuit, coupled to said storage circuit, and enabling said storage circuit for receiving said input data;
    wherein after said enable circuit enables said storage circuit, said enable circuit disables said storage circuit for receiving said input data and drives said enable circuit of said another driver to enable said storage circuit of said another driver to receive said input data transmitted by said control circuit.

14. The serially driving structure of claim 13, wherein said timing controller coupled to said storage circuit for transmitting said input data to said storage circuit; and said timing controller is further coupled to said enable circuit and drives said enable circuit to enable said storage circuit.

15. The serially driving structure of claim 12, wherein said at least one driving group includes a plurality of driving groups; said at least one control circuit includes a plurality of control circuits; and said control circuits are coupled to said driving groups and control said driving groups.

16. The serially driving structure of claim 15, wherein each
    said control circuit comprises:
    said input interface, receiving said input data; and
    an enable circuit, coupled to said input interface, and enabling said input interface for receiving said input data;
    wherein after said enable circuit of said control circuit enables said input interface, said enable circuit of said control circuit disables said input interface for receiving said input data and drives said enable circuit of another control circuit to enable said input interface of said another control circuit to receive said input data.

17. A serially driving structure for display panel, comprising:
    a plurality of driving groups, disposed on a display panel, each said driving group including a plurality of drivers coupled in series, and each driver coupled to at least one display component of said display panel; and
    a plurality of control circuits, disposed on said display panel, coupled to said driving groups, and controlling said driving groups, each control circuit comprising an enable circuit;
    wherein said enable circuit enables said control circuit receiving an input data, after said enable circuit enables said control circuit, said enable circuit disables said control circuit for receiving said input data and drives said enable circuit of another control circuit to enable said another control circuit receiving said input data.

18. The serially driving structure of claim 17, wherein each said control circuit comprises:
    an input interface, receiving said input data; and
    said enable circuit, coupled to said input interface, and enabling said input interface for receiving said input data;
    wherein after said enable circuit enables said input interface, said enable circuit disables said input interface for receiving said input data and drives said enable circuit of said another control circuit to enable said input interface of said another control circuit to receive said input data.

\* \* \* \* \*